United States Patent
Okusa et al.

(10) Patent No.: US 6,316,339 B1
(45) Date of Patent: Nov. 13, 2001

(54) SEMICONDUCTOR DEVICE AND PRODUCTION METHOD THEREOF

(75) Inventors: Yoshihiro Okusa; Tatsuya Yamauchi, both of Nobeoka (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/513,343

(22) Filed: Feb. 25, 2000

Related U.S. Application Data (62) Division of application No. 08/984,144, filed as application No.PCT/JP96/01541 on Jun. 6, 1996, now Pat. No. 6,069,388.

(30) Foreign Application Priority Data

Jun. 6, 1995 (JP) .................................................. 7-139633

(51) Int. Cl.$^7$ .................................................. H01L 21/20
(52) U.S. Cl. .................. 438/489; 438/239; 438/251; 438/486; 438/488; 438/491
(58) Field of Search .............................. 438/16, 239, 240, 438/251, 488, 489, 490, 491, 973, 486, 150, 255

(56) References Cited

U.S. PATENT DOCUMENTS

| | | | | |
|---|---|---|---|---|
| 4,240,845 | * | 12/1980 | Esch et al. ............................. | 438/251 |
| 4,305,760 | * | 12/1981 | Trudel .................................... | 438/16 |
| 4,441,249 | * | 4/1984 | Alspector et al. .................... | 438/396 |
| 4,613,382 | * | 9/1986 | Katayama et al. .................... | 438/488 |
| 4,693,759 | * | 9/1987 | Noguchi et al. ....................... | 117/8 |
| 5,220,482 | | 6/1993 | Takemura et al. ................... | 361/311 |
| 5,290,729 | | 3/1994 | Hayashide et al. ................... | 437/60 |
| 5,324,679 | | 6/1994 | Kim et al. . | |
| 5,389,580 | * | 2/1995 | Miyasaka ............................ | 438/479 |

(List continued on next page.)

FOREIGN PATENT DOCUMENTS

| | | |
|---|---|---|
| 3-263370 | 11/1991 | (JP) . |
| 4-320370 | 11/1992 | (JP) . |
| 5-90490 | 4/1993 | (JP) . |

OTHER PUBLICATIONS

Y. Hayashide et al., "Fabrication of Storage Capacitance–Enhanced Capacitors with a Rough Electrode," Extended Abstracts of the 22$^{nd}$ Conference on Solid State Devices and Materials, pp. 896–872 (1990).

W. Scot Ruska, Microelectronic Processing An Introduction to the Manufacture of Integrated Circuits, McGraw Hill, 1987, p. 281.*

Primary Examiner—Eddie Lee
Assistant Examiner—José R Diaz
(74) Attorney, Agent, or Firm—Finnegan, Henderson, Farabow, Garrett & Dunner, L.L.P.

(57) ABSTRACT

On a silicon substrate 1 is provided a silicon oxide film 2, on which a polycrystalline silicon film 3 is formed by a low pressure CVD method at a monosilane partial pressure of no more than 10 Pa and a film formation temperature of no lower than 600° C. The polycrystalline silicon film is doped with an impurity such as phosphorus in a concentration of $1\times10^{20}$ atoms/cm$^3$ to $1\times10^{21}$ atoms/cm$^3$ to form a phosphosilicate glass film 6, and after removing it, the polycrystalline silicon film is thermally oxidized in an oxidative atmosphere to form a dielectric film 5 on the surface. A polycrystalline silicon film 4 is formed on the dielectric film 5, which is treated as the oriented polycrystalline silicon film 3a to form an oriented polycrystalline silicon film 4a. The oriented polycrystalline silicon film 4a as an upper electrode and the oriented polycrystalline silicon film 3a as a lower electrode are wired to obtain a semiconductor device having a capacitor. Further, a thin film transistor of a high dielectric strength can be produced in a short time on the polycrystalline silicon which is oriented in a short time.

15 Claims, 4 Drawing Sheets

U.S. PATENT DOCUMENTS

| | | | |
|---|---|---|---|
| 5,420,072 | 5/1995 | Fiordalice et al. | 438/192 |
| 5,859,683 | 1/1999 | Tagusa et al. | 349/138 |
| 5,872,033 * | 2/1999 | Figura | 438/255 |
| 5,880,496 | 3/1999 | Chen et al. | 257/296 |
| 6,136,641 * | 10/2000 | Won et al. | 438/240 |

* cited by examiner

SEMICONDUCTOR DEVICE AND PRODUCTION METHOD THEREOF

This is a division of application Ser. No. 08/984,144, filed Dec. 3, 1997 now U.S. Pat. No. 6,069,388, which is a continuing application of International Application No. PCT/JP96/01541, filed Jun. 6, 1996, all of which are expressly incorporated herein by reference.

This application is based on Patent Application No. 07-139,633 filed Jun. 6, 1995 in Japan, the content of which is incorporated fereinto by reference. In addition, this application is a continuation application of International Application No. PCT/JP96/01541 filed Jun. 6, 1996.

FIELD OF THE INVENTION

The present invention relates to a semiconductor device having a dielectric film formed by thermal oxidation of polycrystalline silicon and to a production method thereof. More specifically, the present invention relates to a semiconductor device having a dielectric film formed by providing polycrystalline silicon of improved film quality, followed by thermal oxidation and to a production method thereof.

DESCRIPTION OF RELATED ART

Figure 1:
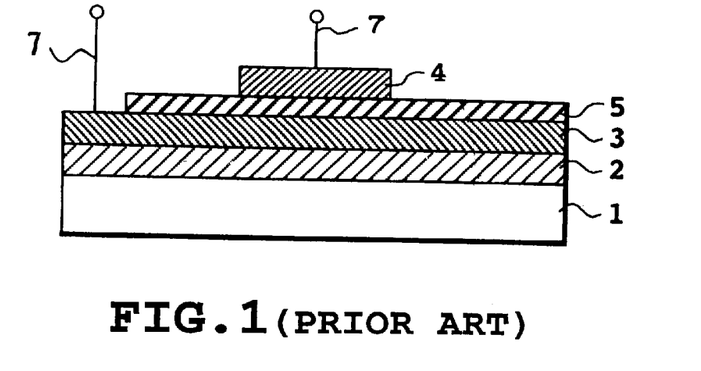
FIG. 1 is a schematic sectional view showing the sectional structure of a prior art capacitor.

A capacitor as a component of IC and LSI is an indispensable part for IC and LSI of a specific field. In general a capacitor of IC and LSI has a structure as shown in FIG. 1 in which a dielectric film 5 is sandwiched between polycrystalline silicon films 3 and 4 on a silicon oxide film 2 on a silicon substrate 1. The polycrystalline silicon films 3 and 4 are individually a lower electrode and an upper electrode, which are individually connected with lead wires 7.

In the production method of such a prior art capacitor, first the polycrystalline silicon film 3 is formed on the silicon oxide film 2 formed on the substrate 1 by way of low pressure CVD (chemical vapor deposition) at a pressure of 28 Pa (monosilane partial pressure: 14 Pa). The polycrystalline silicon film 3, to enhance the electroconductivity as a capacitor electrode, is doped with an impurity of a doping concentration of about $1 \times 10^{19}$ atoms/cm$^3$. In this case, the crystal orientation of the polycrystalline silicon film includes (220), (311), and the like in addition to (111). Next, the dielectric film 4 as an active part of the capacitor is formed by thermal oxidation of the polycrystalline film so as to have a film thickness and an area according to the required capacitance. Then, the polycrystalline silicon film 4 is formed as in the polycrystalline silicon film 3.

A capacitor is normally required to have a dielectric strength of about 8 MV/cm for the dielectric film in order to maintain the reliability. However, there may be a rare case that an abnormal overvoltage is momentarily applied in addition to the rated voltage, or the dielectric film is contaminated with, for example, a metal, or defects of the film occur in the production process of the dielectric film of the capacitor, resulting in degradation of the dielectric strength of the dielectric film.

Further, as a capacitor, there is a problem in that leak current is high between the upper and lower electrodes.

Then, the thickness of the dielectric film has heretofore been increased to enhance the dielectric strength of the dielectric film itself and to reduce the leak current.

However, a high capacitance cannot be obtained by the method of increasing the dielectric film thickness as used in the prior art. Therefore, in order to obtain a high capacitance, it is necessary to increase the surface area, which results in an increased size of the semiconductor device. Further, with increasing down-sizing requirements for semiconductor devices, if a thin film structure of the dielectric film is used to reduce the capacitor size, it is difficult to maintain the dielectric strength and suppress an increase in leak current.

OBJECT OF THE INVENTION

An object of the present invention is to provide a semiconductor device and production method thereof which solve the above described prior art problems.

Another object of the present invention is to provide a semiconductor device having a capacitive component that can maintain the dielectric strength without increasing the thickness of the dielectric film and suppress an increase in leak current and a production method thereof.

DISCLOSURE OF THE INVENTION

In accordance with a first aspect of the present invention, which attains the above object, there is provided a semiconductor device comprising a polycrystalline silicon layer whose main crystal orientation is oriented in (111), an SiO$_2$ layer contacting the polycrystalline silicon layer obtained from the polycrystalline silicon layer, and an electrode contacting the SiO$_2$, wherein a height difference of surface irregularities of the polycrystalline silicon or the dielectric film is no greater than 30 nm.

Here, the dielectric film preferably has a dielectric strength of no less than 8 MV/cm.

According to a second aspect of the present invention, there is provided a capacitor having a dielectric film between an upper electrode and a lower electrode, wherein the lower electrode is a polycrystalline silicon layer having a high conductivity whose main crystal orientation is oriented in (111), and the dielectric film is an SiO$_2$ layer obtained from the polycrystalline silicon layer.

The polycrystalline silicon layer preferably contains an impurity in a concentration of $1 \times 10^{20}$ atoms/cm$^3$ to $1 \times 10^{21}$ atoms/cm$^3$.

Further, the polycrystalline silicon layer or the dielectric film preferably has a height difference of surface irregularities of less than 30 nm.

Still further, the dielectric film preferably has a dielectric strength of no less than 8 MV/cm.

According to a third aspect of the present invention, there is provided a production method of a semiconductor device having a polycrystalline silicon layer and an SiO$_2$ layer obtained from the polycrystalline silicon layer, comprising the steps of: forming the polycrystalline silicon layer by a low pressure CVD method at a monosilane partial pressure of no more than 10 Pa and a film formation temperature of no lower than 600° C.; heat treating the thus formed polycrystalline silicon layer for doping it with an impurity and orienting its main crystal orientation in (111); and thermally oxidizing the surface of the oriented polycrystalline silicon layer to form an SiO$_2$ film.

In this case, prior to thermally oxidizing the surface of the oriented polycrystalline silicon layer, it is preferable to remove the high-concentration oxide film formed on the surface of the polycrystalline silicon layer.

According to a fourth aspect of the present invention, there is provided a production method of a capacitor having a dielectric film between a lower electrode and an upper electrode, comprising the steps of: forming a polycrystalline silicon layer as the lower electrode by a low pressure CVD method at a monosilane partial pressure of no more than 10 Pa and a film formation temperature of no lower than 600° C.; heat treating the formed polycrystalline silicon layer for doping with an impurity and orienting its main crystal orientation in (111); and thermally oxidizing the surface of the oriented polycrystalline silicon layer to form an $SiO_2$ film.

In this case, the polycrystalline silicon layer may be formed on the dielectric film by the low pressure CVD method at a monosilane partial pressure of no more than 10 Pa and a film formation temperature of no lower than 600° C., and then heat treatment may be made for doping with an impurity and orienting its main crystal orientation in (111).

Further, it is preferable to make doping with the impurity to a concentration of $1\times10^{20}$ atoms/cm$^3$ to $1\times10^{21}$ atoms/cm$^3$.

Still further, prior to thermally oxidizing the surface of the oriented polycrystalline silicon layer, it is preferable to remove the high-concentration oxide film formed on the surface of the polycrystalline silicon layer.

BRIEF DESCRIPTION OF THE DRAWINGS

FIG. 7A to FIG. 7E are schematic sectional views illustrating the production process of the capacitor according to the present invention;

FIG. 8A to FIG. 8E are schematic sectional views illustrating the production process of the thin film transistor according to the present invention;

BEST MODE FOR PRACTICING THE INVENTION

Herein, the term main crystal orientation indicates a direction perpendicular to the main orientation plane, wherein the main orientation plane is defined as an orientation plane which gives the greatest ratio among those normalized as a ratio of the strength of orientation plane to the total strength of a sample in the analysis by XRD or the like.

The present invention will now be described in detail with reference to the accompanying drawings.

Figure 2:
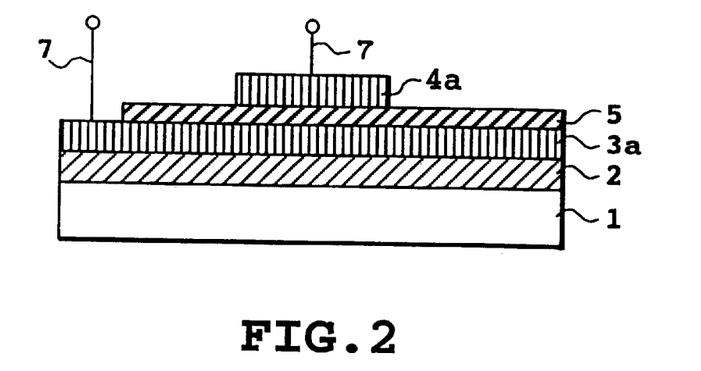
FIG. 2 is a schematic sectional view showing the sectional structure of the capacitor according to the present invention.

FIG. 2 shows the sectional structure of the capacitor according to the present invention. As shown in FIG. 2, a silicon oxide film 2 is provided on a silicon substrate 1, and a polycrystalline silicon layer 3a is formed on the silicon oxide film 2. The polycrystalline silicon layer 3a is highly electroconductive, and the main orientation thereof is in (111). On the polycrystalline silicon layer 3a is formed a dielectric film 5 comprising $SiO_2$ layer, which is a thermal oxide of the polycrystalline silicon. On the dielectric film 5 is formed a polycrystalline silicon layer 4a, which is highly conductive similar to the polycrystalline silicon layer 3a and whose main crystal orientation is oriented in (111). That is, the polycrystalline silicon layers 3a and 4a sandwich the dielectric film 5 therebetween, with the polycrystalline silicon layers 3a and 4a being a lower electrode and an upper electrode, respectively. Further, these electrodes are individually connected with respective lead wires 7.

Figure 3:
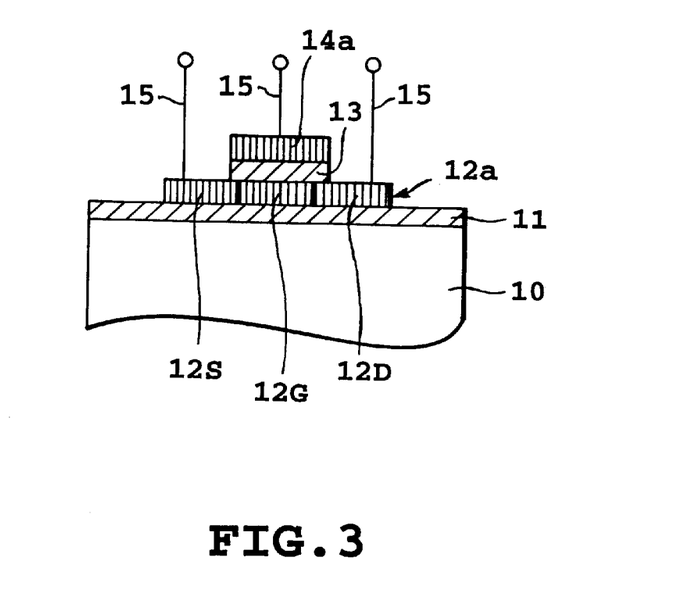
FIG. 3 is a schematic sectional view showing the sectional structure of the thin film capacitor according to the present invention.

FIG. 3 is a schematic sectional view showing the sectional structure of a thin film transistor having the dielectric film structure according to the present invention. In FIG. 3, there are formed on, for example, an n-type silicon substrate 10, a source portion 12S of the reverse conductive type (for example, p-type) to the silicon substrate, a gate portion 12G of the same conductive type (for example, n-type) as the silicon substrate, and a drain portion 12D of the reverse conductive type (for example, p-type) to the silicon substrate, through a silicon oxide film 11. The source portion 12S, the gate portion 12G, and the drain portion 12D comprise polycrystalline silicon layers whose main crystal orientations are oriented in (111). The source portion 12S and the drain portion 12D are highly conductive. The gate portion 12G is doped with an impurity in such a concentration that the threshold voltage of the thin film transistor is not too high for practical use. A gate dielectric film 13 is provided so that the gate portion is covered therewith. The gate dielectric film 13 comprises $SiO_2$, which is a thermal oxide of the polycrystalline silicon layer 12a and whose main crystal orientation is oriented in (111), forming the source portion 12S, the gate portion 12G, and the drain portion 12D. In the thin film transistor according to the present invention, a height difference of surface irregularities of the polycrystalline silicon layer or the dielectric film is no greater than 30 nm. The source portion 12S, the drain portion 12D, and a gate electrode 14a are individually connected with respective lead wires 12.

The semiconductor device having the above-described layered structure can be produced by a conventional method known in the art, for example, by a low pressure CVD method. However, formation of the $Sio_2$ layer as a thermal oxide of the polycrystalline silicon layer whose main crystal orientation is oriented in (111) is carried out according to the present invention as follows. Specifically, when polycrystalline silicon is formed on the silicon oxide film on the silicon substrate by the low pressure CVD method, partial pressure of monosilane is set to no higher than 10 Pa, thereby forming polycrystalline silicon in a state that is readily oriented in (111) by subsequent heat treatment. The crystal is oriented in (111) by heat treatment in which the polycrystalline silicon film is doped with an impurity as heat treatment after the film formation. In the case of the gate dielectric film of the thin film transistor, the concentration of the impurity for doping the polycrystalline silicon is set to a high concentration so that the threshold voltage is within the practically tolerable range.

Figure 4:
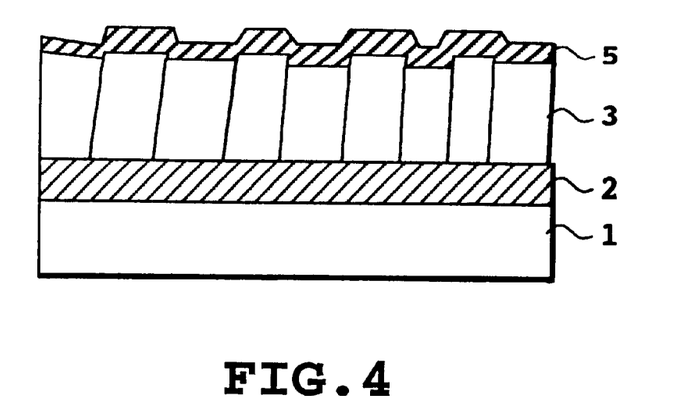
FIG. 4 is a schematic view showing the shapes of a polycrystalline silicon film as a lower electrode and of a dielectric film of the capacitor according to the present invention.
Figure 5:
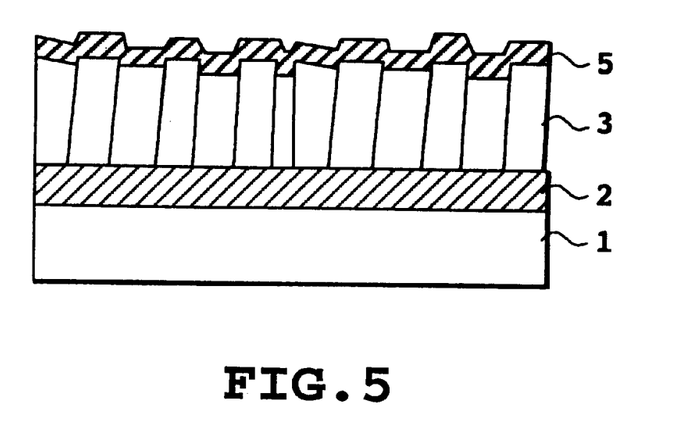
FIG. 5 is a schematic sectional view showing the shapes of a polycrystalline silicon film as a lower electrode and of a dielectric film of a capacitor of Comparative Example 2.
Figure 6:
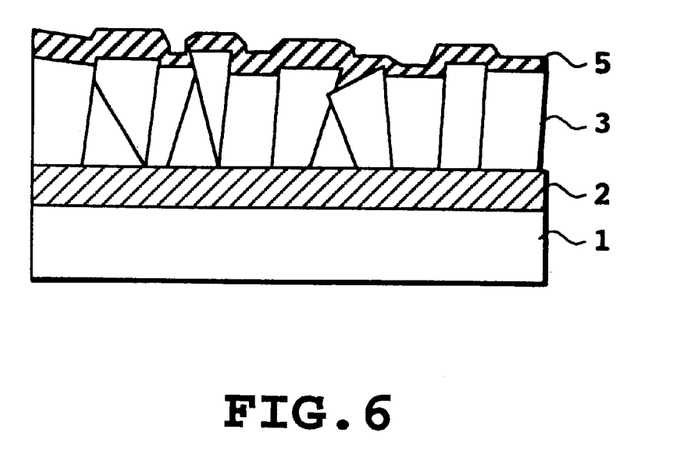
FIG. 6 is a schematic sectional view showing the shapes of a polycrystalline silicon film as a lower electrode and of a dielectric film of a prior art capacitor.

As the dopant, phosphorus is typically used, and arsenic or boron can be used as well. The orientation is accelerated when the dopant concentration is high compared to low concentration. The treatment temperature for doping with phosphorus is normally 800° C. to 1,000° C., preferably 950° C. The temperature when the oriented polycrystalline silicon film is heat-treated to form a dielectric film is normally 950° C. to 1,150° C., preferably 1,000° C. The polycrystalline silicon film whose main crystal orientation is oriented in (111) has a regular columnar structure, and the surface state is also regular even with some irregularities in height. The state is shown in FIGS. 4, 5, and 6. FIG. 4 is a schematic sectional view showing the sectional structures of the polycrystalline silicon film and of the dielectric film in the stage of step 4 in Example 1 of the present invention, FIG. 5 is a schematic view corresponding to FIG. 4 when the doping phosphorus concentration is low in step 2 in Example 1, and FIG. 6 is a schematic view corresponding to FIG. 2 in the prior art production method. FIGS. 4 to 6 are schematic views illustrating the results obtained by a transmission electron microscope. Since the surface irregularities are relatively large in amount in FIG. 5, it can be seen that the surface state is more improved in high-concentration doping (FIG. 4). In the state obtained by the prior art method as shown in FIG. 6, the shape of polycrystalline silicon is irregular with large surface steps, having large amounts of steep changes. The height difference of surface irregularities is about 20 nm to 25 nm in the case of FIG. 4, whereas 35 nm to 50 nm in the case of FIG. 6.

In the state of FIG. 4 according to the present invention, the dielectric film obtained by thermally oxidizing the surface of the polycrystalline silicon film has no steep step portions and thus does not tend to cause electrical field concentration. Further, the film formation speed by thermal oxidation depends on the crystal orientation of polycrystalline silicon. Therefore, the film formation speed can be made constant by regulating the crystal orientation, thereby obtaining uniform thickness of the formed dielectric film. Still further, this reduces surface irregularities and thus leak current due to electrical field concentration at irregularities.

With these effects, a dielectric film of high dielectric strength and reduced leak current is formed. Use of the dielectric film enables a thin film capacitor.

DETAILED DESCRIPTION OF PREFERRED EXAMPLES

Example 1

An example of the production method of the capacitor according to the present invention is illustrated in FIGS. 7A to 7E.

Figure 7A:
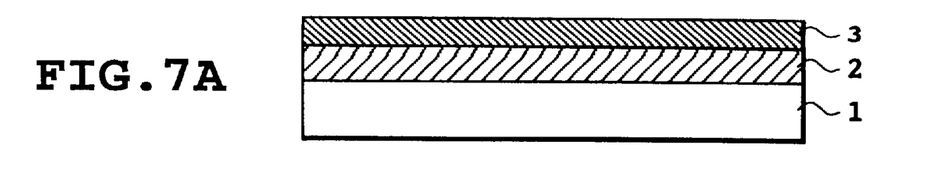
FIG. 7A is a schematic sectional view showing the structure in a stage when a silicon oxide film and a polycrystalline silicon film are formed on a substrate.

<Step 1>
A silicon substrate ($SiO_2$/Si) formed with a silicon oxide film 2 is provided on which is formed a polycrystalline silicon film to a thickness of about 3500 Å on the silicon oxide film 2 by a low pressure CVD method using a raw material gas (monosilane gas diluted with helium to 50%) under conditions of a film formation temperature of 640° C., a pressure of 16 Pa (monosilane partial pressure: 8 Pa), and a film formation time of about 35 minutes (FIG. 7A).

Figure 7B:
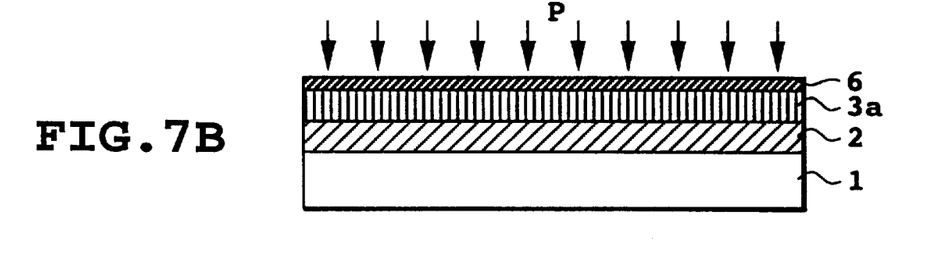
FIG. 7B is a schematic sectional view showing the structure in a stage when a phosphosilicate glass film is formed on the polycrystalline silicon film and the polycrystalline silicon is oriented.

<Step 2>
The substrate formed with the polycrystalline silicon film 3 is heat treated while forming an oxide film in a heat treatment furnace using phosphorus oxychloride and oxygen as a source gas under conditions of 950° C. for 10 minutes to form about 100 Å of a phosphosilicate glass film 6 on the polycrystalline silicon film 3. The phosphorus is doped in an amount of $1\times10^{20}$ atoms/cm$^3$ to $1\times10^{21}$ atoms/cm$^3$. By this heat treatment, the crystal orientation of polycrystalline silicon is arranged in (111) (FIG. 7B).

Figure 7C:
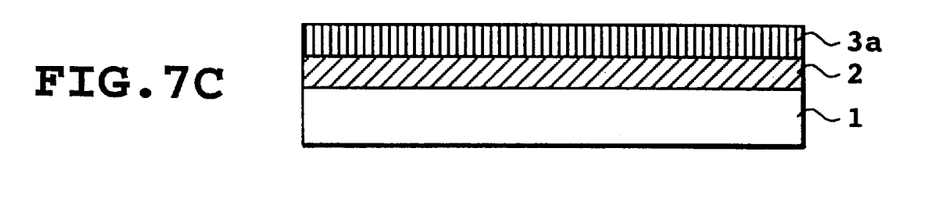
FIG. 7C is a schematic sectional view showing the structure in a stage when the phosphosilicate glass film is removed.

<Step 3>
The phosphosilicate glass film 6 formed in step 2 is removed by etching with an HF solution (FIG. 7C).

Figure 7D:
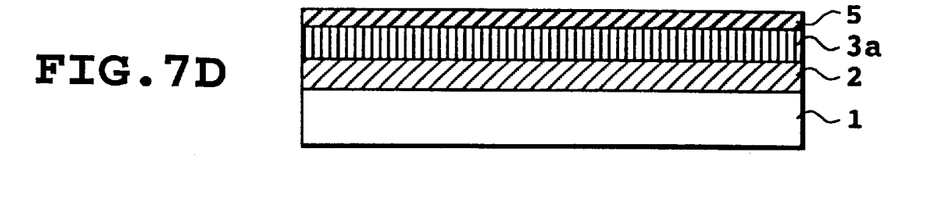
FIG. 7D is a schematic sectional view showing the structure in a stage when the oriented polycrystalline silicon film is thermally oxidized to form a dielectric film.

<Step 4>
The substrate having the oriented polycrystalline silicon film 3a is treated in a heat treatment furnace at 1000° C. for 40 minutes using nitrogen gas and oxygen gag to thermally oxidize the surface of the oriented polycrystalline silicon film, thus forming a dielectric film of 30 nm.

Figure 7E:
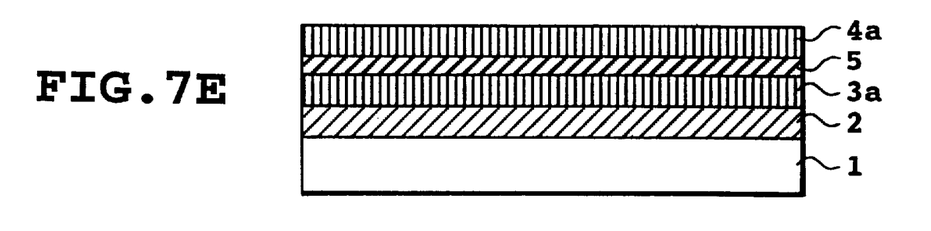
FIG. 7E is a schematic sectional view showing the structure in a stage when a similarly oriented polycrystalline silicon film is formed on the dielectric film.

<Step 5>
A polycrystalline silicon film is formed as in step 1 on the dielectric film as an upper electrode of the capacitor, which is treated as in step 2 and step 3 to form an oriented polycrystalline silicon film 4a (FIG. 7E).

<Step 6>
The oriented polycrystalline silicon film 4a is patterned by photolithography using a mask to form the upper electrode and, further, a part of the oriented polycrystalline silicon film 3a as a lower electrode is exposed. Then, the upper electrode and the lower electrode are wired by bonding gold wires or the like to obtain a capacitor (FIG. 2).

Example 2

A capacitor was produced using the same procedure as in the Example 1 except that the monosilane partial pressure was set to 5 Pa.

Test Example 1

Using the capacitors obtained by Examples 1 and 2 of the present invention, a capacitor as Comparative Example 1 produced using the polycrystalline silicon film formed under the condition of a total pressure of 22 Pa in step 1 of Example 1 and using the same subsequent procedures as in Example 1, and a capacitor as Comparative Example 2 produced using a phosphorus doping amount of $1\times10^{19}$ atoms/cm$^3$ in step 2 of Example 1 and using the same subsequent procedures as in Example 1, were measured for dielectric strength.

As a result, the capacitors of Example 1 and Example 2 of the present invention showed a dielectric strength of no lower than 8 MV/cm, whereas the capacitors of Comparative Example 1 and Comparative Example 2 both had a dielectric strength of no higher than 3 MV/cm.

Further, leak currents at an electrical field of 4 MV/cm were about 5 pA/cm$^2$ for the capacitors of Examples 1 and 2 of the present invention, whereas about 5 nA/cm$^2$ for both capacitors of Comparative Examples 1 and 2.

These results are shown in Table 1.

TABLE 1

|  | Total pressure (Pa) | Monosilane partial pressure (Pa) | Doping amount (atoms/cm$^3$) | Dielectric strength (MV/cm) | Leak current (field: 4 MV/cm) |
|---|---|---|---|---|---|
| Example 1 | 16 | 8 | $1 \times 10^{20}$ to $1 \times 10^{21}$ | no lower than 8 | about 5 pA/cm$^2$ |
| Example 2 | 10 | 5 | $1 \times 10^{20}$ to $1 \times 10^{21}$ | no lower than 8 | about 5 pA/cm$^2$ |
| Comp. Ex. 1 | 22 | 11 | $1 \times 10^{20}$ to $1 \times 10^{21}$ | no higher than 3 | about 5 nA/cm$^2$ |
| Comp. Ex. 2 | 16 | 8 | $1 \times 10^{19}$ | no higher than 3 | about 5 nA/cm$^2$ |

As described above, enhancement of the dielectric strength of the dielectric film itself and reduction in the leak current, allows reduction in the film thickness of the dielectric film, thereby reducing the device size of the capacitor.

Example 3

An example of the production method of the thin film transistor according to the present invention will be described with reference to FIGS. 8A to 8E.

<Step 1>

Figure 8A:
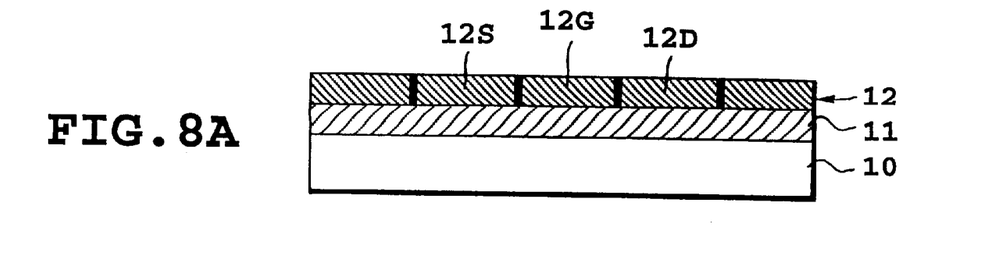
FIG. 8A is a schematic sectional view showing the structure in a stage when a silicon oxide film and a polycrystalline silicon film are formed on a substrate.

A silicon oxide (SiO$_2$) film 11 is formed on a silicon (Si) substrate 10, further on top of which is formed a polycrystalline silicon 12 to a thickness of about 1500 Å by a low pressure CVD method using a material gas (monosilane gas diluted with helium to 50%) at a film formation temperature of 640° C. and a pressure of 10 Pa (monosilane partial pressure: 5 Pa) (FIG. 8A).

<Step 2>

Figure 8B:
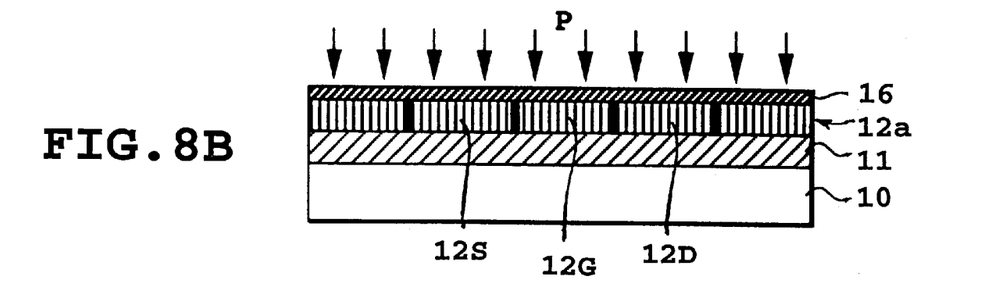
FIG. 8B is a schematic sectional view showing the structure in a stage when a phosphosilicate glass film is formed on the polycrystalline silicon film and the polycrystalline silicon is oriented.

The thus treated substrate is heat treated in a heat treatment furnace while forming an oxide film (phosphosilicate glass film) 16 using phosphorus oxychloride and oxygen as a source gas at a temperature of 950° C. By the heat treatment, the crystal orientation of polycrystalline silicon including the gate portion (body portion) is arranged in (111) (FIG. 8B).

<Step 3>

Figure 8C:
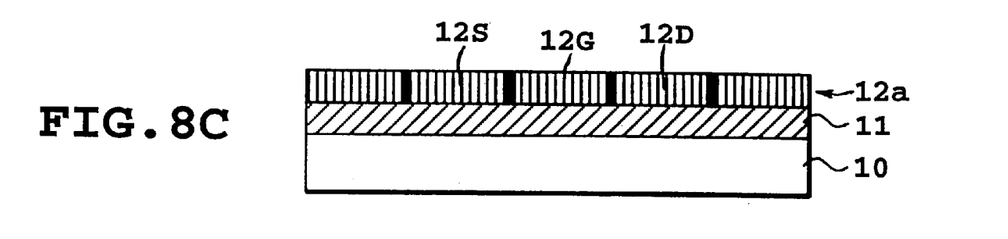
FIG. 8C is a schematic sectional view showing the structure in a stage when the phosphosilicate glass film is removed.

The phosphosilicate glass film 16 formed in step 2 is removed by etching with an HF solution (FIG. 8C).

<Step 4>

Figure 8D:
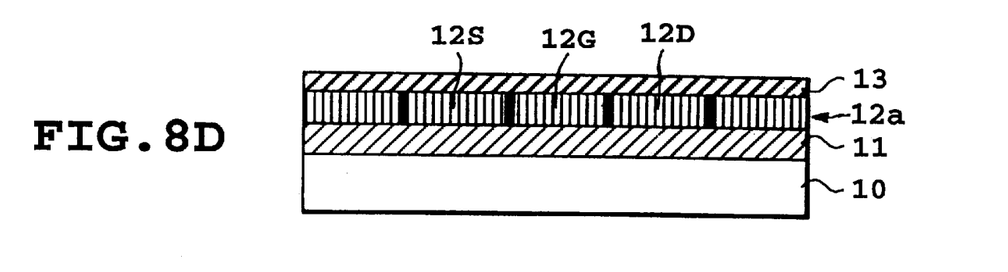
FIG. 8D is a schematic sectional view showing the structure in a stage when the oriented polycrystalline silicon film is thermally oxidized to form a dielectric film.

The substrate having the oriented polycrystalline silicon film 12a is thermally oxidized in a heat treatment furnace at 1000° C. to form a dielectric film 13 of 1000 Å in thickness (FIG. 8D).

<Step 5>

Figure 8E:
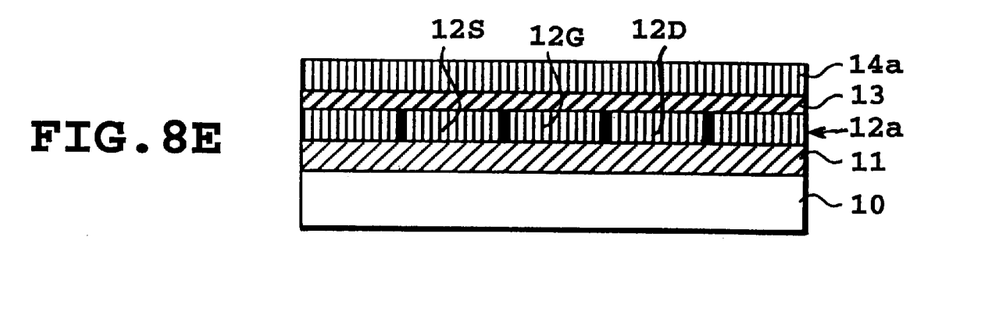
FIG. 8E is a schematic sectional view showing the structure in a stage when a similarly oriented polycrystalline silicon film is formed on the dielectric film.

An electroconductive polycrystalline silicon film 14a is formed on the dielectric film 13 (FIG. 8E).

<Step 6>

The polycrystalline silicon film 14a is patterned by photolithography using a mask to form a gate electrode and, further, the source and drain portions are doped to form electrodes. Then, the source electrode and the drain electrode are wired by bonding gold wires 15 or the like to obtain a thin film transistor (FIG. 3).

By the method, in the thin film transistor, polysilicon is oriented in (111) by doping by heat treatment in a short time. As a result, a transistor having a high dielectric strength of the dielectric film formed on the oriented polysilicon can be produced in a short time, even though the threshold voltage is increased because of an increased impurity concentration of the body portion (gate portion).

After the polycrystalline silicon is formed at a monosilane partial pressure of no more than 10 Pa in the material gas, the polycrystalline silicon film is oriented in (111) to have a regular columnar structure by doping with the impurity in the heat treatment, and the dielectric film formed thereon has no steep portions, reducing generation of electric field concentration.

Further, by arranging the crystal orientation, the film formation speed is made constant, thereby forming a dielectric film of an uniform thickness.

INDUSTRIAL APPLICABILITY

With these effects, a dielectric film is formed which is high in dielectric strength and small in leak current, thereby enabling a thin film structure of the capacitor.

Further, according to the present invention, a thin film transistor of high dielectric strength can be produced in a short time.

What is claimed is:

1. A production method of a semiconductor device having a polycrystalline silicon layer and a dielectric film obtained from said polycrystalline silicon layer, comprising the steps of:

forming said polycrystalline silicon layer by a low pressure CVD method at a monosilane partial pressure of no more than 10 Pa and a film formation temperature of no lower than 600° C.;

heat treating said formed polycrystalline silicon layer for doping with an impurity to orient its main orientation in (111); and thermally oxidizing the surface of said oriented polycrystalline silicon layer to form the dielectric film.

2. The production method of a semiconductor device as claimed in claim 1, wherein prior to thermally oxidizing the surface of said oriented polycrystalline silicon layer, a high-concentration oxide film formed on the surface of said polycrystalline silicon layer is removed.

3. The production method of a semiconductor device as claimed in claim 1, wherein a height difference of surface irregularities of either said polycrystalline silicon layer or said dielectric film is no more than 30 nm.

4. The production method of a semiconductor device as claimed in claim 1, wherein said heat treating is performed at a temperature of 800° C. to 1000° C.

5. The production method of a semiconductor device as claimed in claim 1, wherein said heat treating is performed while doping.

6. A production method of a semiconductor device having a dielectric film between a lower electrode and an upper electrode, comprising the steps of:

forming a first polycrystalline silicon layer as the lower electrode by a low pressure CVD method at a monosilane partial pressure of no more than 10 Pa and a film formation temperature of no lower than 600° C.;

heat treating said formed first polycrystalline silicon layer for doping with an impurity to orient its main crystal orientation in (111)

thermally oxidizing the surface of said oriented first polycrystalline silicon layer to form a dielectric film; and forming said upper electrode on said dielectric film.

7. The production method of a semiconductor device as claimed in claim 6, wherein a second polycrystalline layer is formed on said dielectric film by a low pressure CVD method at a monosilane partial pressure of no more than 10 Pa and a film formation temperature of no lower than 600° C., and heat treated for doping with an impurity to orient its main crystal orientation in (111).

8. The production method of a semiconductor device as claimed in claim 7, wherein doping with an impurity is made to an impurity concentration of $1 \times 10^{20}$ atoms/cm$^3$ to $1 \times 10^{21}$ atoms/cm$^3$.

9. The production method of a semiconductor device as claimed in claim 8, wherein prior to thermally oxidizing the surface of said oriented first polycrystalline silicon layer, a high-concentration layer formed on the surface of said first polycrystalline silicon layer is removed.

10. The production method of a semiconductor device as claimed in claim 7, wherein a height difference of surface irregularities of said second polycrystalline silicon layer is no more than 30 nm.

11. The production method of a semiconductor device as claimed in claim 6, wherein doping with an impurity is made to an impurity concentration of $1 \times 10^{20}$ atoms/cm$^3$ to $1 \times 10^{21}$ atoms/cm$^3$.

12. The production method of a semiconductor device as claimed in claim 6, wherein a height difference of surface irregularities of either said first polycrystalline silicon layer or said dielectric film is no more than 30 nm.

13. The production method of a semiconductor device as claimed in claim 6, wherein said heat treating is performed at a temperature of 800° C. to 1000° C.

14. The production method of a semiconductor device as claimed in claim 6, wherein said heat treating is performed while doping.

15. The production method of a semiconductor device in any one of claims 1–14, wherein the semiconductor device is a capacitor and wherein the dielectric film is an SiO$_2$ film.

* * * * *